(12) United States Patent
Chiu et al.

(10) Patent No.: US 8,754,531 B2
(45) Date of Patent: Jun. 17, 2014

(54) THROUGH-SILICON VIA WITH A NON-CONTINUOUS DIELECTRIC LAYER

(75) Inventors: Yu-Shan Chiu, New Taipei (TW); Kuo-Hui Su, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 247 days.

(21) Appl. No.: 13/419,451

(22) Filed: Mar. 14, 2012

(65) Prior Publication Data
US 2013/0241063 A1 Sep. 19, 2013

(51) Int. Cl.
| | | |
|---|---|---|
| H01L 23/48 | (2006.01) | |
| H01L 21/44 | (2006.01) | |
| H01L 23/522 | (2006.01) | |
| H01L 21/768 | (2006.01) | |
| H01L 23/532 | (2006.01) | |

(52) U.S. Cl.
CPC .......... H01L 23/481 (2013.01); H01L 23/5226 (2013.01); H01L 21/76877 (2013.01); H01L 21/76898 (2013.01); H01L 21/76831 (2013.01); H01L 23/53238 (2013.01); H01L 21/76843 (2013.01)
USPC ........... 257/774; 257/775; 257/786; 438/653; 438/680

(58) Field of Classification Search
CPC ............ H01L 23/481; H01L 21/76807; H01L 21/76831; H01L 21/76877; H01L 23/5226; H01L 23/53238; H01L 21/76898; H01L 21/76843
USPC .................. 257/762–764, 770, 773–775, 786; 438/653, 680, 687; 427/250
See application file for complete search history.

(56) References Cited

U.S. PATENT DOCUMENTS

| | | | |
|---|---|---|---|
| 7,629,249 B2 * | 12/2009 | Borthakur | 438/637 |
| 7,915,736 B2 * | 3/2011 | Kirby et al. | 257/774 |
| 2009/0226611 A1 * | 9/2009 | Suzuki et al. | 427/250 |
| 2010/0130007 A1 * | 5/2010 | Wang et al. | 438/666 |
| 2010/0200412 A1 | 8/2010 | Reid | |
| 2011/0136336 A1 | 6/2011 | Akram | |
| 2012/0056331 A1 * | 3/2012 | Park | 257/774 |
| 2012/0190188 A1 * | 7/2012 | Zhao et al. | 438/627 |
| 2013/0213816 A1 * | 8/2013 | Chiu et al. | 205/123 |

* cited by examiner

Primary Examiner — Alonzo Chambliss

(74) Attorney, Agent, or Firm — Winston Hsu; Scott Margo

(57) ABSTRACT

A through-silicon via (TSV) includes an insulation layer continuously lining a straight sidewall of a recessed via feature; a barrier layer continuously covering the insulation layer; a first portion of a non-continuous seed layer disposed at one end of the recessed via feature; a non-continuous dielectric layer partially covering the straight sidewall of the recessed via feature; and a conductive layer filling the recessed via feature.

9 Claims, 5 Drawing Sheets

THROUGH-SILICON VIA WITH A NON-CONTINUOUS DIELECTRIC LAYER

BACKGROUND OF THE INVENTION

1. Field of the Invention

The present invention relates generally to semiconductor technology, and more particularly to a through-silicon via (TSV) for connection of stacked chips and a method for forming the same.

2. Description of the Prior Art

Through-silicon via is typically fabricated to provide the through-via filled with a conducting material that passes completely through the silicon substrate layer to contact and connect with the other TSVs and conductors of the bonded layers. For example, a vertical hole is defined through a predetermined portion of each chip at a wafer level. An insulation layer is formed on the surface of the vertical hole. With a seed metal layer formed on the insulation layer, a metal is filled into the vertical hole through an electroplating process to form a TSV. Then, the TSV is exposed through back-grinding of the backside of a wafer.

After the wafer is sawed and is separated into individual chips, at least two chips can be vertically stacked, one atop the other, on one of the substrates using one or more of the TSV. Thereupon, the upper surface of the substrate including the stacked chips is molded, and solder balls are mounted on the lower surface of the substrate.

Typically, to form a TSV, a continuous copper seed layer is employed inside a recessed via feature. For example, U.S. Pat. Pub. No. 2009/0226611 A1 discloses that to form a void-free bulk copper metal filling of a recessed feature in integrated circuits, the interior sidewalls of the recessed feature is covered with a continuous, smooth copper seed layer.

U.S. Pat. Pub. No. 2010/0200412 A1 teaches that it is undesirable to form a seed layer that is significantly thicker around the TSV opening because the thick seed layer around the TSV opening results in lower resistance at the opening and consequently high local deposition rates.

As the dimension of the TSVs shrinks, it becomes more and more difficult to form a void-free or seamless copper plated TSV structure. Therefore, there is a need in this industry to provide an improved method in order to form a void-free or seamless copper plated TSV structure.

SUMMARY OF THE INVENTION

The above object will be achieved by the through-silicon via (TSV) in the present invention which comprises an insulation layer continuously lining a straight sidewall of a recessed via feature; a barrier layer continuously covering the insulation layer; a first portion of a non-continuous seed layer disposed at one end of the recessed via feature; a non-continuous dielectric layer partially covering the straight sidewall of the recessed via feature; and a conductive layer filling the recessed via feature.

In another aspect of the invention, there is provided a TSV comprising an insulation layer continuously lining a straight sidewall of a recessed via feature; a barrier/seed layer continuously covering the insulation layer; a non-continuous dielectric layer partially covering the straight sidewall of the recessed via feature; and a copper layer filling the recessed via feature.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1A:
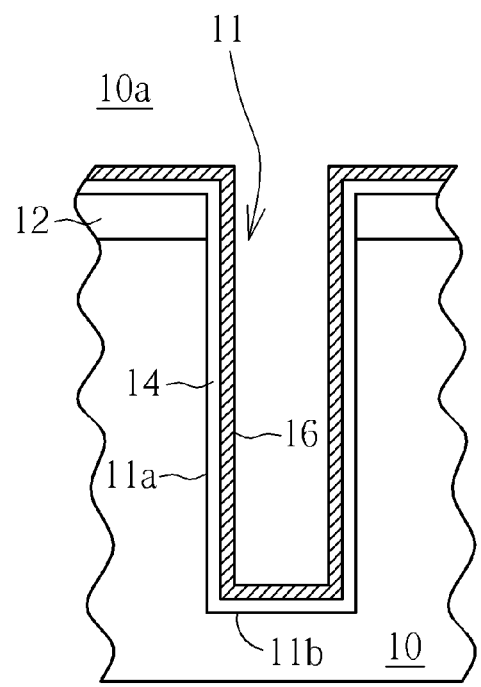
FIGS. 1A-1F are schematic, cross-sectional diagrams showing a method for fabricating a through-silicon via (TSV) in a semiconductor substrate in accordance with one preferred embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

FIGS. 1A-1F are schematic, cross-sectional diagrams showing a method for fabricating a through-silicon via (TSV) in a semiconductor substrate in accordance with one preferred embodiment of this invention. As shown in FIG. 1A, a semiconductor substrate 10 such as a silicon substrate is provided. The semiconductor substrate 10 has a front side 10a and a backside 10b that is to be grinded at a later stage. Typically, integrated circuits comprising circuit elements such as transistors and/or interconnection scheme are fabricated on the front side 10a of the semiconductor substrate 10. For the sake of simplicity, these circuit elements are not shown in the figures. After the fabrication of the circuit elements and the interconnection structures, a protection insulation layer 12 such as a silicon oxide layer or a silicon nitride layer is deposited to cover the front side 10a in a blanket manner. A recessed via feature 11 is then etched into the protection insulation layer 12 and the semiconductor substrate 10.

Typically, the recessed via feature 11 has a high aspect ratio, for example, a depth to diameter aspect ratio of from about 5 to 20. The recessed via feature 11, which does not extend through the entire thickness of the substrate at this point, comprises a substantially straight sidewall 11a and a bottom surface 11b. A conformal insulation layer 14 such as an oxide layer may be formed on the straight sidewall 11a and the bottom surface 11b. The insulation layer 14 may also cover the top surface of the protection insulation layer 12.

Subsequently, a conformal barrier layer 16 such as TaN, TiN, TaCN or TiW is formed on the insulation layer 14. According to this embodiment, the barrier layer 16 is a continuous layer and the entire sidewall 11a and bottom surface 11b of the recessed via feature 11 are continuously covered by the barrier layer 16. The barrier layer 16 may be formed by physical vapor deposition (PVD) methods.

Figure 1B:
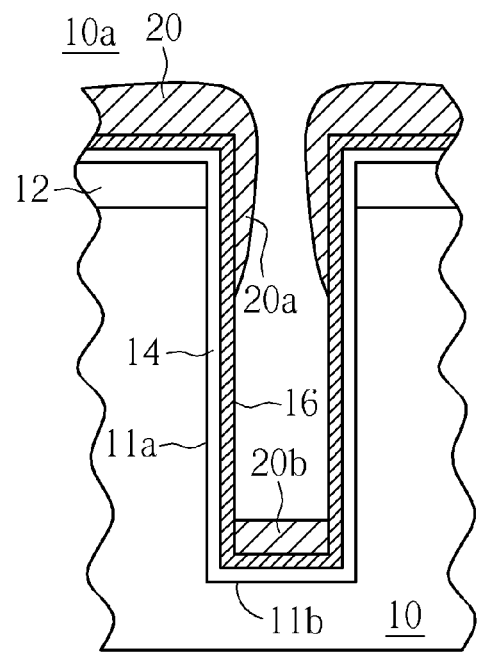

As shown in FIG. 1B, a non-continuous seed layer 20 such as tungsten or copper is then deposited inside the recessed via feature 11. Preferably, the non-continuous seed layer 20 may comprise a thicker first portion 20a that is deposited around the upper end of the recessed via feature 11 and a second portion 20b that is merely deposited on the bottom surface 11b of the recessed via feature 11. A discontinuity is provided between the first portion 20a and the second portion 20b. According to this embodiment, a lower portion of the straight sidewall 11a is not covered with the non-continuous seed layer 20. To form such non-continuous seed layer 20, a low step-coverage PVD process may be employed. During the PVD process, an RF bias may be turned off to directly deposit tungsten onto the bottom surface 11b of the recessed via feature 11.

Figure 1C:
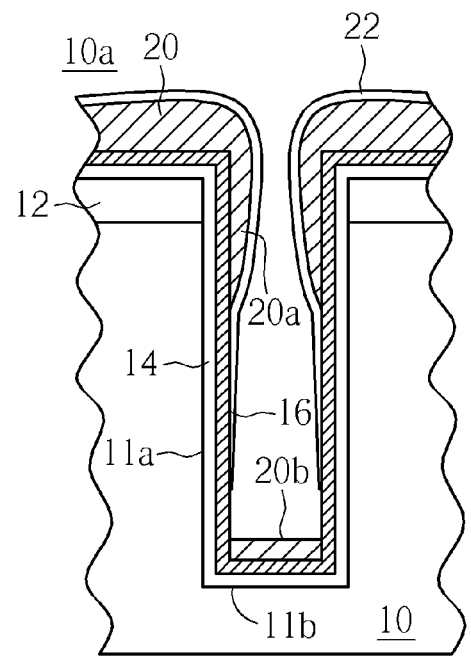

As shown in FIG. 1C, after the formation of the non-continuous seed layer 20, a non-continuous dielectric layer 22 such as silicon oxide, SiNx or AlOx is deposited to cover the first portion 20a of the non-continuous seed layer 20 and substantially the entire lower portion of the straight sidewall 11a not covered with the non-continuous seed layer 20. The second portion 20b of the non-continuous seed layer 20 is not covered by the non-continuous dielectric layer 22 to facilitate the following copper plating process. The non-continuous dielectric layer 22 may be deposited by chemical vapor deposition (CVD) or atomic layer deposition (ALD) methods. According to this embodiment, the thickness of the non-continuous dielectric layer 22 may range between 5-200 angstroms.

Figure 1D:
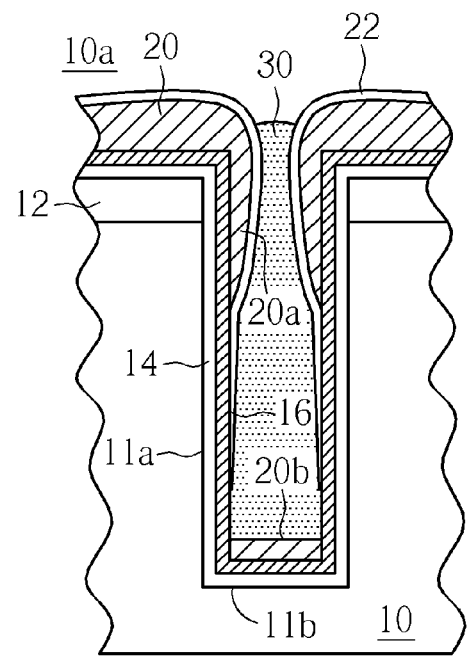

As shown in FIG. 1D, a copper plating process is carried out to fill the recessed via feature 11 with copper layer 30. Since the straight sidewall 11a is covered with the non-continuous dielectric layer 22, the copper plating process only occurs from the top surface of the second portion 20b of the non-continuous seed layer 20 (bottom-up fill). According to this embodiment, the copper plating process may be an electroless plating process. In other embodiments, other metals such as Ni, Pd or Co may be used to fill the recessed via feature 11.

Figure 1E:
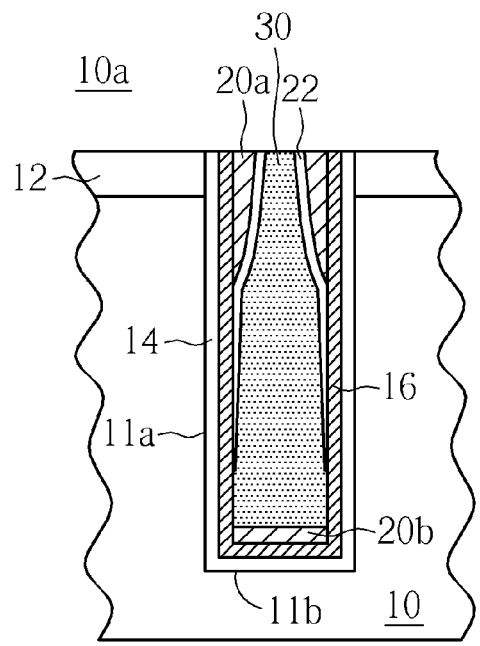

As shown in FIG. 1E, after the copper plating process, a chemical mechanical polishing (CMP) process is performed to polish the front side 10a. During CMP, the insulation layer 14, the barrier layer 16, the first portion 20a of the non-continuous seed layer 20, the non-continuous dielectric layer 22 and the copper layer 30 outside the recessed via feature 11 are removed to thereby form a flattened front side 10a. After the CMP, the top surface of the protection insulation layer 12 is exposed. The protection insulation layer 12 may also act as a CMP stop layer.

Figure 1F:
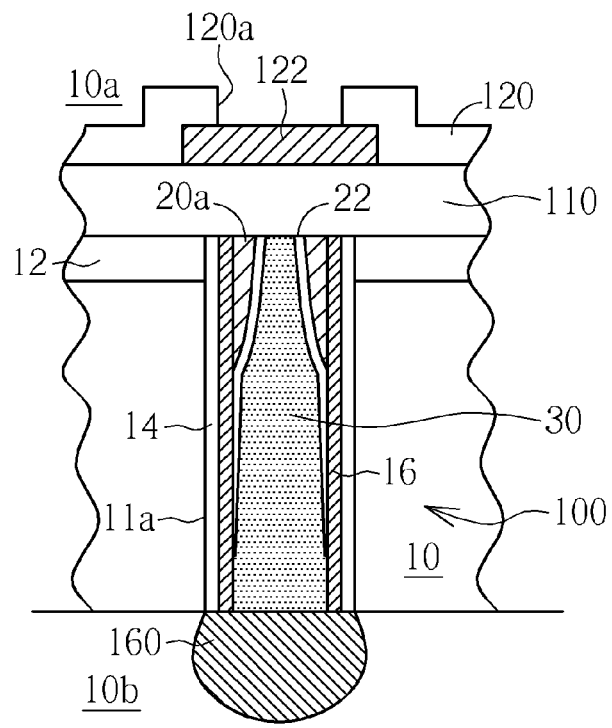

As shown in FIG. 1F, at least a dielectric layer 110 is then deposited onto the flattened front side 10a and at least a pad layer 122 such as a wire bonding pad or a bump pad may be formed on the dielectric layer 11. At least a passivation layer 120 may be formed on the dielectric layer 110 and may have an opening 120a exposing a top surface of the pad layer 122. The pad layer 122 may be electrically connected to the underlying copper layer 30. Subsequently, the backside 10b of the semiconductor substrate 10 is polished to expose the copper layer 30, thereby forming a TSV 100 that communicates the front side 10a and the backside 10b. A solder ball 160 may be formed on the exposed copper layer 30 for connecting the circuits on the front side 10a to an external circuit board or device.

Still referring to FIG. 1F, structurally, the TSV 100 comprises a conformal insulation layer 14 continuously lining a straight sidewall 11a of a recessed via feature 11, a barrier layer 16 continuously covering the insulation layer 14, a first portion 20a of a non-continuous seed layer 20 disposed at one end of the recessed via feature 11, a non-continuous dielectric layer 22 partially covering the straight sidewall 11a of the recessed via feature 11, and a plated copper layer 30 filling the recessed via feature 11.

Figure 2A:
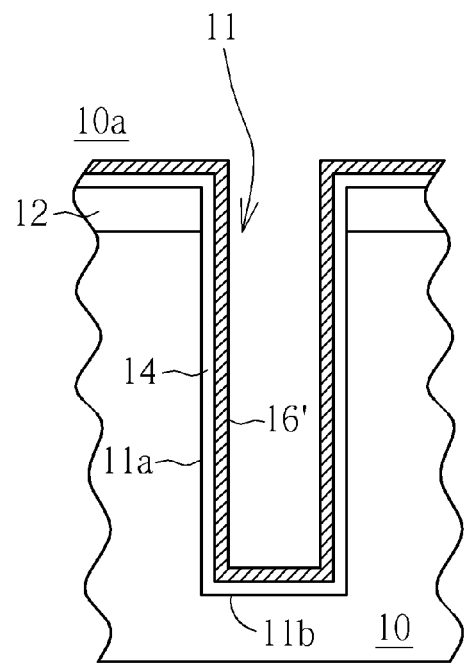
FIGS. 2A-2C are schematic, cross-sectional diagrams showing a method for fabricating a TSV in a semiconductor substrate in accordance with another preferred embodiment of this invention.
Figure 2B:
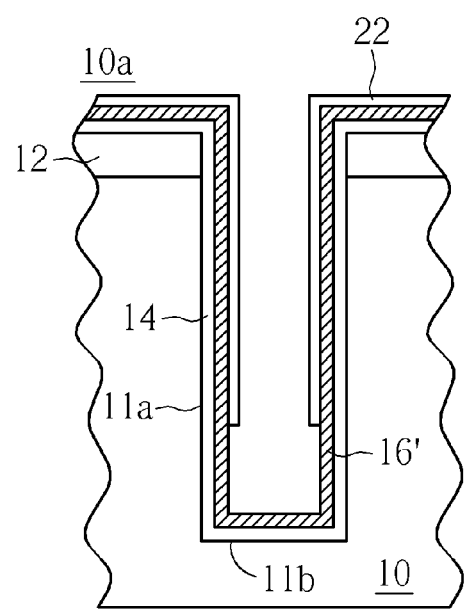
Figure 2C:
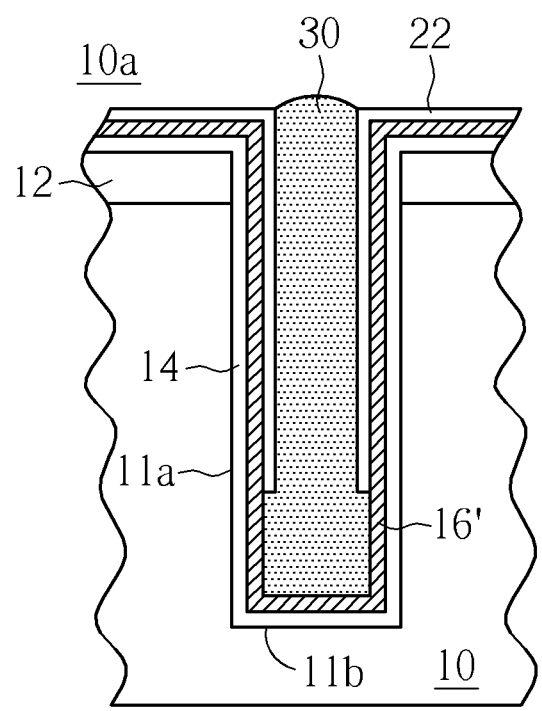

FIGS. 2A-2C are schematic, cross-sectional diagrams showing a method for fabricating a TSV in a semiconductor substrate in accordance with another preferred embodiment of this invention. As shown in FIG. 2A, likewise, a semiconductor substrate 10 such as a silicon substrate is provided. The semiconductor substrate 10 has a front side 10a and a backside 10b that is to be grinded at a later stage. Typically, integrated circuits comprising circuit elements such as transistors and/or interconnection scheme are fabricated on the front side 10a of the semiconductor substrate 10. For the sake of simplicity, these circuit elements are not shown in the figures. After the fabrication of the circuit elements and the interconnection structures, a protection insulation layer 12 such as a silicon oxide layer or a silicon nitride layer is deposited to cover the front side 10a in a blanket manner. A recessed via feature 11 is then etched into the protection insulation layer 12 and the semiconductor substrate 10.

The recessed via feature 11 has a high aspect ratio, for example, a depth to diameter aspect ratio of from about 2 to 20. The recessed via feature 11, which does not extend through the entire thickness of the substrate at this point, comprises a substantially straight sidewall 11a and a bottom surface 11b. A conformal insulation layer 14 such as an oxide layer may be formed on the straight sidewall 11a and the bottom surface 11b. The insulation layer 14 may also cover the top surface of the protection insulation layer 12. Subsequently, a conformal barrier/seed layer 16' such as Ru or W is formed on the insulation layer 14. According to this embodiment, the barrier/seed layer 16' is a continuous layer and the entire sidewall 11a and bottom surface 11b of the recessed via feature 11 are continuously covered by the barrier/seed layer 16'. The barrier/seed layer 16' may be formed by PVD methods.

As shown in FIG. 2B, a non-continuous dielectric layer 22 such as silicon oxide is deposited to cover an upper portion of the barrier/seed layer 16'. The barrier/seed layer 16' on the bottom surface 11b is not covered by the non-continuous dielectric layer 22 to facilitate the following copper plating process. The non-continuous dielectric layer 22 may be deposited by chemical vapor deposition (CVD) or atomic layer deposition (ALD) methods. According to this embodiment, the thickness of the non-continuous dielectric layer 22 may range between 5-200 angstroms.

As shown in FIG. 2C, a copper plating process is carried out to fill the recessed via feature 11 with copper layer 30. Since the straight sidewall 11a is covered with the non-continuous dielectric layer 22, the copper plating process only occurs from the top surface of the barrier/seed layer 16' on the bottom surface 11b (bottom-up fill). According to this embodiment, the copper plating process may be an electroless plating process. In other embodiments, other metals such as Ni, Pd or Co may be used to fill the recessed via feature 11.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A through-silicon via (TSV) comprising:
   an insulation layer continuously lining a straight sidewall of a recessed via feature;
   a barrier layer continuously covering the insulation layer;
   a first portion of a non-continuous seed layer disposed at one end of the recessed via feature;
   a non-continuous dielectric layer partially covering the straight sidewall of the recessed via feature; and
   a conductive layer filling the recessed via feature.

2. The TSV according to claim 1 wherein the conductive layer is a plated copper layer.

3. The TSV according to claim 1 wherein the insulation layer comprises silicon oxide or silicon nitride.

4. The TSV according to claim 1 wherein the barrier layer comprises TaN, TiN, TaCN or TiW.

5. The TSV according to claim 1 wherein the non-continuous seed layer comprises tungsten.

6. The TSV according to claim 1 wherein the non-continuous seed layer is PVD tungsten.

7. The TSV according to claim 1 wherein the non-continuous dielectric layer comprises silicon oxide.

8. The TSV according to claim 1 wherein the non-continuous dielectric layer insulates the first portion of a non-continuous seed layer from the conductive layer.

9. The TSV according to claim 1 wherein the second portion of the non-continuous seed layer is not covered by the non-continuous dielectric layer.

* * * * *